(12) United States Patent
Park et al.

(10) Patent No.: US 8,013,514 B2
(45) Date of Patent: Sep. 6, 2011

(54) ELECTROLUMINESCENT DISPLAY DEVICE PROVIDED WITH A PHOTONIC CRYSTAL LAYER INCORPORATING VOIDS IN A VACUUM STATE

(75) Inventors: Jin-Woo Park, Yongin-si (KR);
Ho-Kyoon Chung, Yongin-si (KR);
Jang-Hyuk Kwon, Suwon-si (KR);
Mu-Hyun Kim, Suwon-si (KR);
Seung-Yong Song, Hwaseong-si (KR);
Young-Rag Do, Seoul (KR);
Yoon-Chang Kim, Suwon-si (KR);
Tae-Min Kang, Suwon-si (KR);
Seong-Taek Lee, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 134 days.

(21) Appl. No.: 12/536,049

(22) Filed: Aug. 5, 2009

(65) Prior Publication Data

US 2009/0295284 A1 Dec. 3, 2009

Related U.S. Application Data

(62) Division of application No. 10/992,219, filed on Nov. 19, 2004, now Pat. No. 7,589,461.

(30) Foreign Application Priority Data

Nov. 28, 2003 (KR) .................................. 2003-85819

(51) Int. Cl.
*H01L 51/50* (2006.01)
*H01L 51/52* (2006.01)

(52) U.S. Cl. ........ 313/501; 313/110; 313/112; 313/506; 313/509

(58) Field of Classification Search .......... 313/500–512, 313/110–114
See application file for complete search history.

(56) References Cited

U.S. PATENT DOCUMENTS

| 6,221,553 B1 | 4/2001 | Wolk et al. |
| 6,366,017 B1 | 4/2002 | Antoniadis et al. |

(Continued)

FOREIGN PATENT DOCUMENTS

CN 1454034 11/2003

(Continued)

OTHER PUBLICATIONS

Lee et al. "A high-extraction-efficiency nanopatterned organic light-emitting diode" Applied Physics Letters vol. 82, No. 21, May 26, 2003, pp. 3779-3781.*

(Continued)

*Primary Examiner* — Mariceli Santiago
(74) *Attorney, Agent, or Firm* — H.C. Park & Associates, PLC

(57) ABSTRACT

The invention is directed to an organic electroluminescent (EL) display device having an improved light extracting efficiency due to a photonic crystal layer formed proximate one side of a stack. Among other elements, the stack may include a first electrode formed on a substrate, an organic light emitting layer formed above the first electrode, and a second electrode formed above the organic light emitting layer. Additionally, the photonic crystal layer may be configured to correspond to a wavelength of colored light. An organic EL display device having an improved light extracting efficiency may be manufactured using a thermal transfer donor film to adhere the photonic crystal layer to the stack.

1 Claim, 8 Drawing Sheets

U.S. PATENT DOCUMENTS

| | | |
|---|---|---|
| 7,084,565 B2 | 8/2006 | Cho et al. |
| 2001/0033409 A1 | 10/2001 | Takada |
| 2002/0004307 A1 | 1/2002 | Yamada |
| 2003/0057417 A1 | 3/2003 | Lee |
| 2003/0164496 A1 | 9/2003 | Do et al. |
| 2003/0214691 A1 | 11/2003 | Magno et al. |
| 2005/0127831 A1 | 6/2005 | Takeuchi et al. |

FOREIGN PATENT DOCUMENTS

| | | |
|---|---|---|
| EP | 1039561 A2 * | 9/2000 |
| JP | 11-283751 | 10/1999 |
| JP | 11-307266 | 11/1999 |
| JP | 11-514791 | 12/1999 |
| JP | 2000-200687 | 7/2000 |
| JP | 2001160654 A * | 6/2001 |
| JP | 2002-008868 | 1/2002 |
| JP | 2002-075656 | 3/2002 |
| JP | 2002091344 A * | 3/2002 |
| JP | 2002-158095 | 5/2002 |
| JP | 2002-534782 | 10/2002 |
| JP | 2003-109749 | 4/2003 |
| JP | 2003-150082 | 5/2003 |
| JP | 2003-163075 | 6/2003 |
| JP | 2003-243153 | 8/2003 |
| JP | 2004-119286 | 4/2004 |
| JP | 2004-296438 | 10/2004 |
| KR | 10-2003-0025683 | 3/2003 |
| KR | 10-2003-0026450 | 4/2003 |

OTHER PUBLICATIONS

Do et al. "Enhanced Light Extraction from Organic Light-Emitting Diodes with 2D SiO2/SiNx Photonic Crystal" Advanced Materials, 15, No. 14, Jul. 17, 2003, pp. 1214-1218.*

Chinese Office Action dated Dec. 4, 2009.

Chinese Office Action mailed May 22, 2009 for CN Application No. 200410103806.X.

Chinese Office Action mailed May 9, 2008.

Office Action dated May 20, 2008 (for co-pending U.S. Appl. No. 10/992,219).

Office Action dated Dec. 12, 2008 (for co-pending U.S. Appl. No. 10/992,219).

Notice of Allowance dated May 4, 2009 (for co-pending U.S. Appl. No. 10/992,219).

Office Action issued Feb. 25, 2011 in co-pending U.S. Appl. No. 12/536,057.

* cited by examiner

ELECTROLUMINESCENT DISPLAY DEVICE PROVIDED WITH A PHOTONIC CRYSTAL LAYER INCORPORATING VOIDS IN A VACUUM STATE

CROSS-REFERENCE TO RELATED APPLICATIONS

This application is a divisional application of U.S. patent application Ser. No. 10/992,219, filed on Nov. 19, 2004 and claims the benefit of Korean Patent Application No. 2003-85819, filed on Nov. 28, 2003, in the Korean Intellectual Property Office, which are herein incorporated by reference.

BACKGROUND OF THE INVENTION

1. Field of the Invention

The present invention relates to an organic electroluminescent (EL) display device and a thermal transfer donor film used in manufacturing an organic EL display device. More particularly, the invention relates to an EL display device having a high efficiency of light extraction from an organic light-emitting portion. The higher efficiency is caused in part by a photonic crystal layer located directly on a stack formed on the substrate. Additionally, a laser induced thermal transfer donor film for the EL display device is used to form the photonic crystal layer on the stack.

2. Description of the Related Art

An electroluminescent (EL) display device forms viewable images by reflecting or shining light through an organic thin film material (e.g., a light emitting portion) sandwiched between millions of anodes and cathodes that are formed on opposing surfaces of two parallel glass substrates. Applying a voltage difference to each anode/cathode pair (e.g., pixel) alters the physical properties of the organic light emitting layer. When the voltage differences are applied in discrete amounts, various shades of colors are produced. Organic EL display devices are popular because they are driven by low voltages, are light and thin, and offer wide viewing angles and fast response times.

As mentioned above, the light-emitting portion of the EL display device includes an anode, a light-emitting layer, and a cathode sequentially formed on each other. The light-emitting layer may include an emitting layer (EML) in which exitons are formed by the recombination of holes and electrons to create light. An exiton is an electrically neutral excited state of an insulator or semiconductor, often regarded as a bound state of an electron and an electron hole ("hole"). A hole is a vacant position left in a crystal by the absence of an electron. The EML may further include: an electron transport layer (ETL) located between the cathode and an emitting layer to transport holes and electrons more smoothly to the emitting layer thereby increasing emitting efficiency; a hole transport layer (HTL) located between the anode and the emitting layer; a hole injection layer (HIL) located between the anode and the hole transportation layer; and an electron injection layer (EIL) located between the cathode and the electron transportation layer. Exemplary conventional light-emitting layers can be composed of copper phthalocyanine (CuPc), N,N'-Di (naphthalene-1-yl)-N,N'-diphenyl-benzidine (NPB), or tris-8-hydroxyquinoline aluminum (Alq3).

The light efficiency (e.g., the efficiency at which light is emitted) of such a light-emitting portion depends on internal efficiency, and the efficiency of other layers of the EL display device (external efficiency). A layer's internal efficiency varies depending on the photoelectric conversion efficiency of the material of which the organic light-emitting portion is composed. Similarly, external efficiency varies depending on the refractive index of each layer of the organic EL display device. The external efficiency is also called light coupling efficiency. A problem is that external efficiency is reduced when light emitted from the organic light-emitting layer has an outgoing angle greater than a critical angle of one of the layers. When this happens, reflection occurs at the surface of the layer. Reflection reduces the light, and causes it to emit externally.

Table 1 illustratively shows the light coupling efficiency of a transparent substrate formed of glass and an electrode layer formed of indium-tin-oxide (ITO), for each of blue (B), red (R), and green (G) light. The light coupling efficiency is calculated from the refractive index of each layer, and $N_{in}$ and $N_{out}$ indicate the refractive index of the layer where the light enters and emits, respectively.

TABLE 1

|  | Blue Emitting Layer | Red Emitting Layer | Green Emitting Layer |
|---|---|---|---|
| Wave Length (nm) | 450 | 620 | 530 |
| Electrode Layer Refractive Index (N) | 2.01 | 1.76 | 1.93 |
| Substrate Refractive Index (N) | 1.525 | 1.515 | 1.52 |
| Light Coupling Efficiency | 29% | 37% | 34% |

It can be seen from Table 1 that the light generated from each emitting layer may be reduced by more than 60% due to the refractive index difference between the electrode layer and the substrate. Various methods have been presented to increase such light coupling efficiency.

For example, the Japanese Patent Publication Gazette No. Hei 11-283751 discloses a structure that includes a diffraction grating or zone plate formed on a substrate. This reference also discloses diffracted light leaving an organic film and an Indium Tin Oxide (ITO) electrode.

In such an organic EL device, since irregularities occur on a surface of a substrate, a fine electrode pattern layer, or a separate diffraction grating must be included. This requirement complicates the manufacturing process, making it difficult to attain efficient productivity. Also, the formation of an organic layer on the irregularities in the surface of the substrate or the fine electrode pattern layer increases the overall roughness of the organic layer, which increases current leakage. Current leakage, in turn, deteriorates the durability and reliability of the organic EL device.

An organic EL display device preventing a decrease of light coupling efficiency is disclosed in the Japanese Patent Publication Gazette No. Sho 63-17269. The disclosed organic EL display device includes a substrate having light condensers, such as projecting lenses.

Another organic EL display device is disclosed in the Japanese Patent Publication Gazette No. Hei 1-29394. The display includes a first dielectric layer interposed between a transparent electrode layer and an emitting layer. Additionally, a second dielectric layer having a refractive index less than that of the first dielectric layer and greater than that of the transparent electrode layer is also disclosed.

FIG. 1 is a partial cross-sectional view of a conventional organic EL display device. As shown, an organic light emitting portion including two electrode layers 21 and 22 is formed on a substrate (not shown), and a sealing substrate 10 is formed on a photonic crystal layer 41. A spatial layer 40 formed between the photonic crystal layer 41 and an organic light-emitting portion is either a vacuum or is filled with an inert gas.

Use of the photonic crystal layer 41 may increase light coupling efficiency, however the path along which light travels must be structurally even. Otherwise screen display quality degrades. In order to achieve a uniform screen display quality, the spatial layers 40 should be regularly spaced in the regions where the light of an organic EL display device travels. However, such constraints limit the design and manufacture of EL display devices. Such problems also apply to active matrix (AM) organic EL display devices.

SUMMARY OF THE INVENTION

The invention is directed to an organic electroluminescent (EL) display device having an improved light extracting efficiency due to a photonic crystal layer formed proximate one side of an organic light-emitting portion. The invention is further directed to a thermal transfer donor film used in manufacturing an organic EL display device which has an improved light extracting efficiency.

According to an aspect of the present invention, there is provided an organic EL display device, which includes a substrate. A first electrode layer is formed in a predetermined pattern on the substrate. A stack is also formed on the substrate that includes: a first electrode layer, and an organic light emitting portion formed on the first electrode layer. A photonic crystal layer formed directly on the stack increases the light extracting efficiency of the light-emitting portion.

According to another aspect of the present invention, an organic EL display device may include a photonic crystal layer having a plurality of protrusions. The protrusions may face the stack or may face away from it. Additionally, recessed portions formed between the protrusions may be in a vacuum state or filled with a predetermined gas. Additionally, the recessed portions may be filled with a material having a different refractive index than the material of which the protrusions are composed.

In another embodiment, an organic EL display device includes a photonic crystal layer having a plurality of piercing holes, which may be in a vacuum state or filled with a predetermined gas. Additionally, the plurality of piercing holes may be filled with a material having a different refractive index that the material of which the photonic crystal layer is composed.

According to another aspect of the present invention, there is provided an organic EL display device which includes a substrate. A stack formed on the substrate includes: a first electrode layer formed with a predetermined pattern on the substrate; a second electrode layer and an organic light-emitting portion formed on the first electrode layer; a photonic crystal layer that increases a light extraction efficiency of the light-emitting portion; a refractive layer interposed between the photonic crystal layer and the stack such that the refractive layer is formed directly on the stack. In one embodiment, the refractive layer may be a material having a different refractive index than the material of which the photonic crystal layer is composed.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
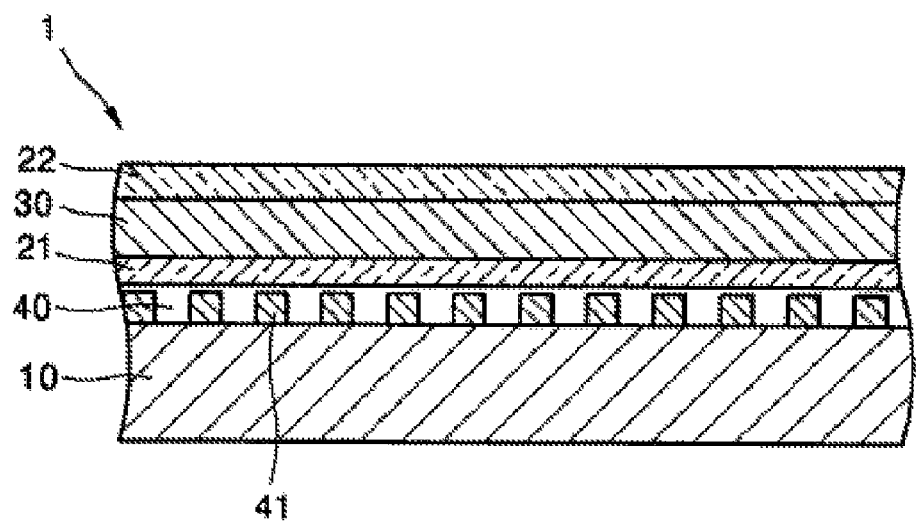
FIG. 1 is a partial cross-sectional view of a general organic electroluminescent (EL) display device.

The claimed invention relates to an improved electroluminescent (EL) display device having an improved efficiency of light transmission by use of a refractive material and a photonic crystal layer. The invention is further directed to a thermal transfer layer which is used to build the photonic crystal layer and to transfer it to an upper surface of the stack.

FIGS. 2A through 2D are cross sectional views of an organic electroluminescent (EL) display device according to embodiments of the present invention. The organic EL display device according to an embodiment of the present invention includes a substrate 210, on which a first electrode layer 230 is formed in a pattern. An organic light-emitting portion 240 is formed on the first electrode layer. A second electrode layer 250 is formed on the organic light emitting portion 240. A photonic crystal layer 260 which increases the light extraction efficiency of an organic light-emitting is formed on the second electrode 250.

The first electrode layer 230 acts as an anode and the second electrode layer 250 acts as a cathode, however, the present invention is not limited to such a structure and can employ a different structure. The first electrode layer 230 may be composed of a transparent conductive material such as ITO formed by vacuum deposition or sputtering. The second electrode layer 250 may be composed of magnesium, lithium, or other element having a small work function. Alternatively, the electrode layer 250 may be a conductive metal such as aluminum, an aluminum compound, silver, a silver compound, etc.

Figure 4:
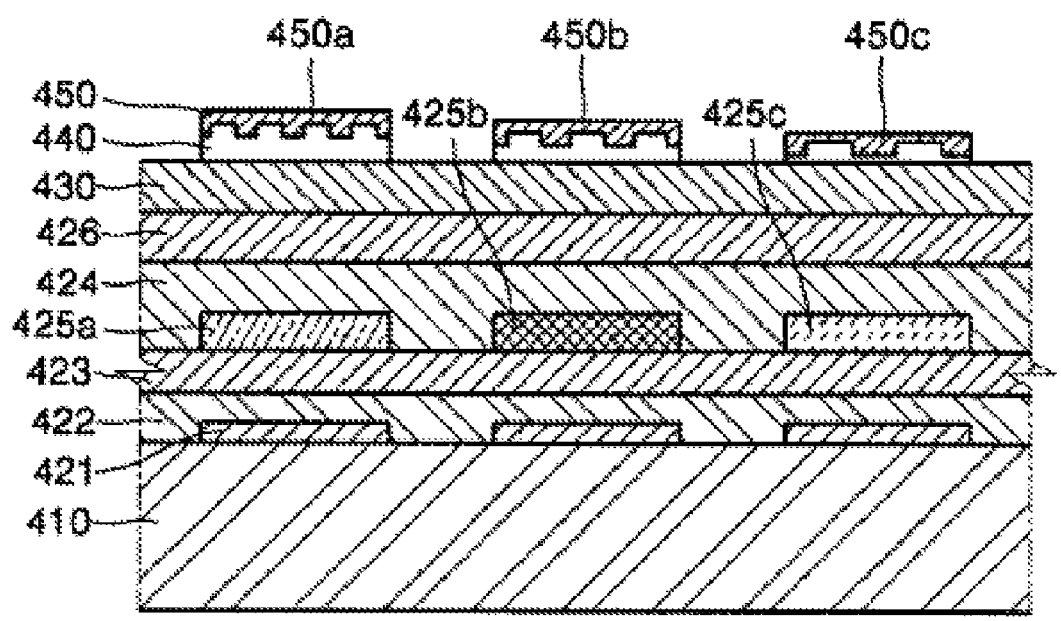
FIG. 4 is an organic EL display device according to another embodiment of the present invention.

The organic light-emitting portion 240, interposed between the first electrode layer 230 and second electrode layer 250, may further include: a hole injection layer, a hole transportation layer, R, G, B emitting layers, an electron injection layer, and an electron transportation layer. Illustrative placements of these layers are shown in FIG. 4.

According to on embodiment of the present invention, a portion of the photonic crystal layer 260 of the organic EL display device is arranged proximate the stack so that it is firmly in contact with one side of the stack. In this particular embodiment, there are no spatial layers formed between the photonic crystal layer 260 and stack.

The photonic crystal layer 260 may be formed of organic materials and inorganic materials. For example, the photonic crystal layer 260 may be composed of a photoresist (PR) or a transparent organic material, which is capable of heat transfer, and which has a molecular weight less than 100,000. Alternatively, the photonic crystal layer 260 may be composed of one or more of $SiO_x$, $SiN_x$, $Si_3N_4$, $TiO_2$, $MgO$, $ZnO$, $Al_2O_3$, $SnO_2$, $In_2O_3$, $MGF_2$, and $CaF_2$. When using an organic material with a molecular weight greater than 100,000 in the photonic crystal layer 260, the photonic crystal layer 260 may be partially ripped off in a laser induced thermal imaging process. Thus, depending on the embodiment, the photonic crystal layer 260 may be smoothly or non-smoothly detached from a thermal imaging film to adhere to a top surface of a stack.

Figure 2A:
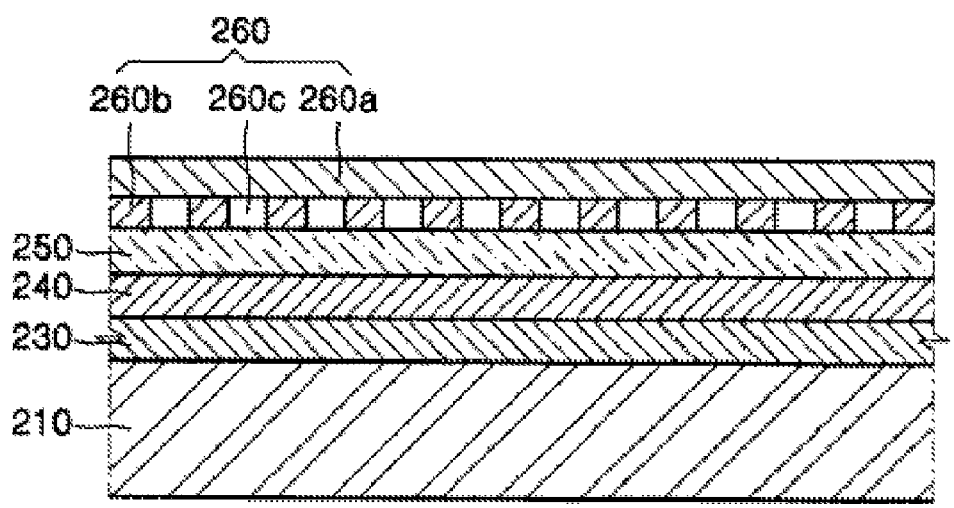
FIGS. 2A, 2B, 2C, and 2D are partial cross-sectional views of an organic EL display device according to embodiments of the present invention.

The photonic crystal layer 260 may have various forms, and as shown in FIG. 2A, protrusions 260b may protrude from one side of the base layer 260a. The protrusions 260b may protrude from a side facing the stack. Alternatively, although not shown in FIG. 2A, the protrusions 260b may protrude away from the stack. As shown in FIG. 2A, when the protrusions 260b protrude toward the stack, they may firmly contact one side of the second electrode layer 250.

Figure 2B:
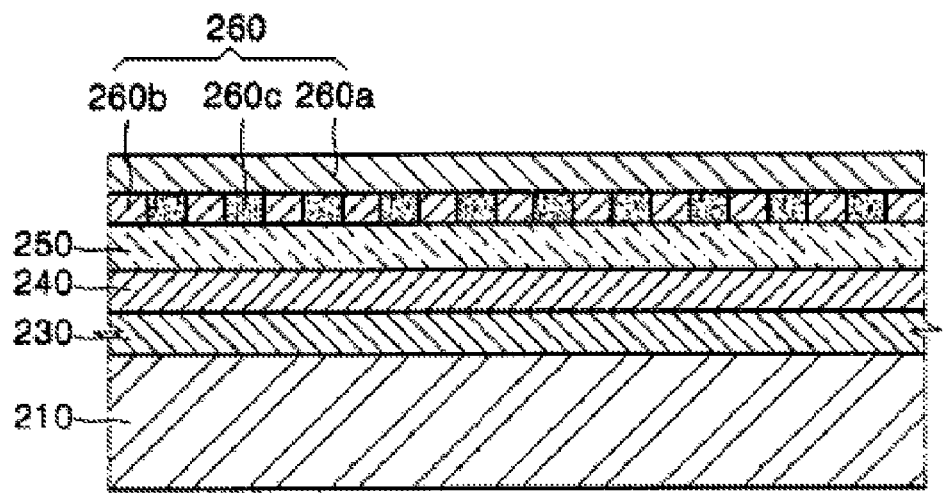

When the photonic crystal layer 260 has protrusions 260b, recessed portions 260c are formed between the protrusions 260b, and these recessed portions 260c may be maintained as a vacuum state. Alternatively, as shown in FIG. 2B, the recesses 260c may be filled with a predetermined inert gas for example, Ne, He, etc. Diffraction occurs in the photonic crystal layer by alternately arranging different states and/or different materials in the individual recesses 260c. For example, all of the recesses may be in a vacuum state or filled with a gas. Alternatively, at least one recess may be filled with gas while at least one other recess is maintained in a vacuum state. The various combinations that may be formed are significant. Although not described here for brevity's sake, all such combinations are to be construed as being within the scope of the claimed invention.

Figure 2C:
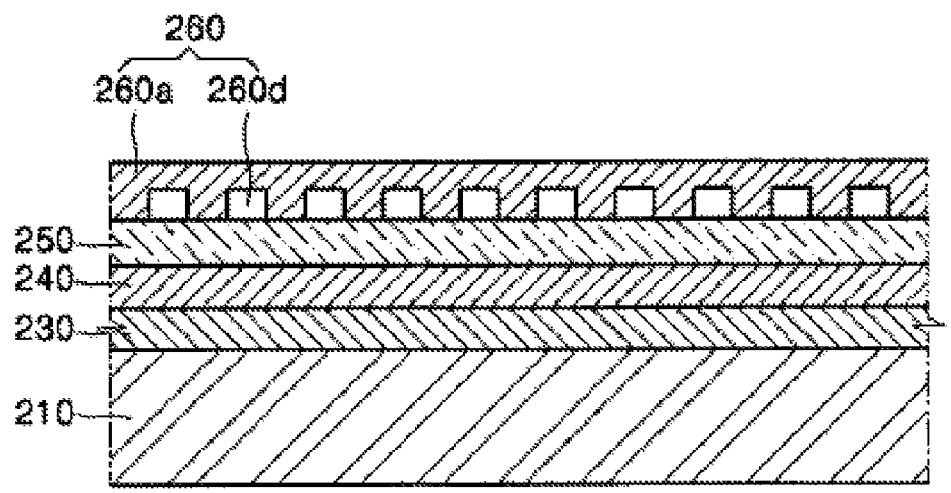
Figure 2D:
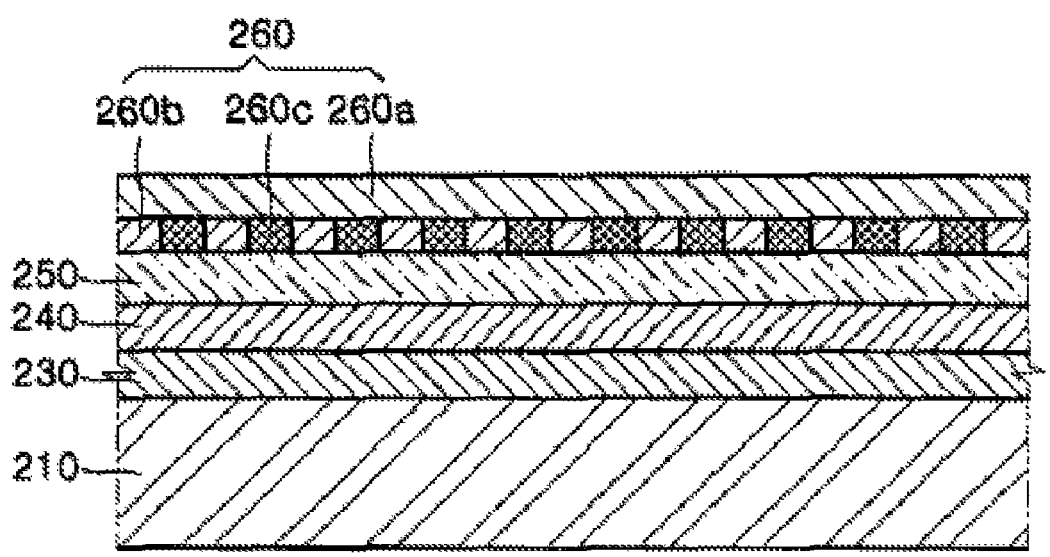

In an alternate embodiment shown in FIG. 2D, diffraction may be increased by filling the recessed portion 260c formed with a material, or combination of materials, that have a different refractive index from the material which composes the protrusions 260b. For example, a suitable filler material may be chosen from various organic materials and inorganic materials such as $SiN_x$, $TiO_2$, etc. If the material filling the recessed portion 260c is to adhere to one side of the stack (for example, the second electrode layer 250), an organic material may be used as the material filling the recessed portion 260c to increase the contactability of the contact surfaces. Additionally, the base layer 260a may be composed of an inorganic material to increase the contactability between the base layer 260a and the recessed portion 260c.

In another embodiment of the present invention, as shown in FIG. 2C, the photonic crystal layer 260 may be a photonic crystal layer with a dot format in which a plurality of piercing holes 260d are formed in the base layer 260a. The piercing holes 260d may be arranged at regular intervals within the base layer 260a, and on one side of the stack. Additionally, when arranged proximate one side of the second electrode layer 250, the piercing holes 260d may be maintained in a vacuum state, or may be filled with a designated gas, for example, an inert gas such as Ne, He, etc.

Additionally, like the organic EL device shown in FIG. 2D, the refractive index may be increased by filling the piercing holes 260d of the photonic crystal layer 260 with a material having a different refractive index from the refractive index of the material of which the base layer 260a is composed. For example, the piercing holes 260d may be filled with an organic material or an inorganic material such as $SiN_x$, or $TiO_2$, etc. Because the material filling the piercing holes 260d should adhere to one side of the stack (for example, the second electrode layer 250), the material filling the piercing holes 260d may be an organic material that increases the contactability between the second electrode layer 250 and the photonic crystal layer 260. Additionally, the base layer 260a of the photonic crystal layer 260 may be composed of an organic material to increase the contactability between the material filling the piercing holes 260d and the base layer 260a.

Figure 3A:
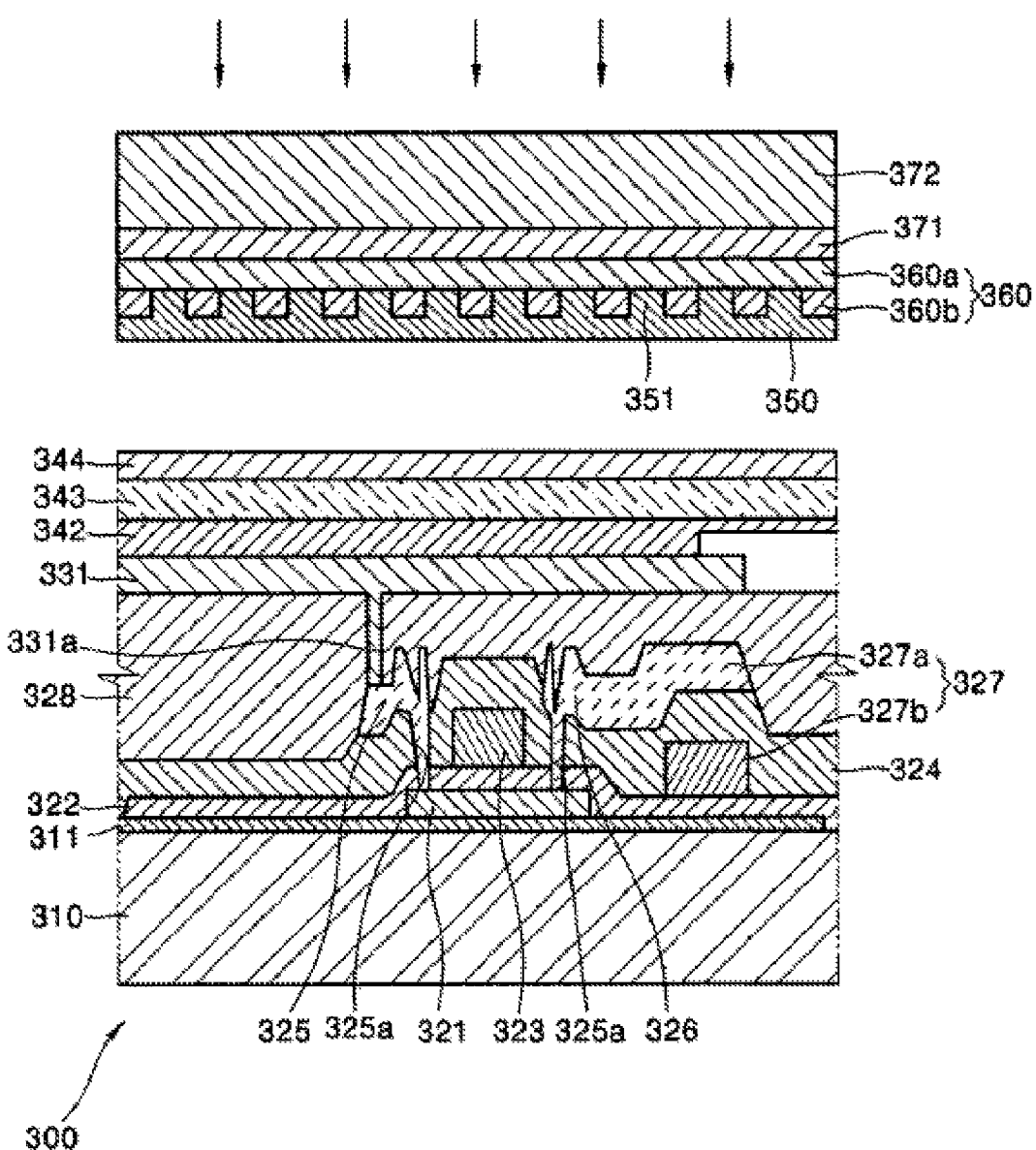
FIGS. 3A and 3B are partial cross-sectional views of an organic EL display device according to embodiments of the present invention.
Figure 3B:
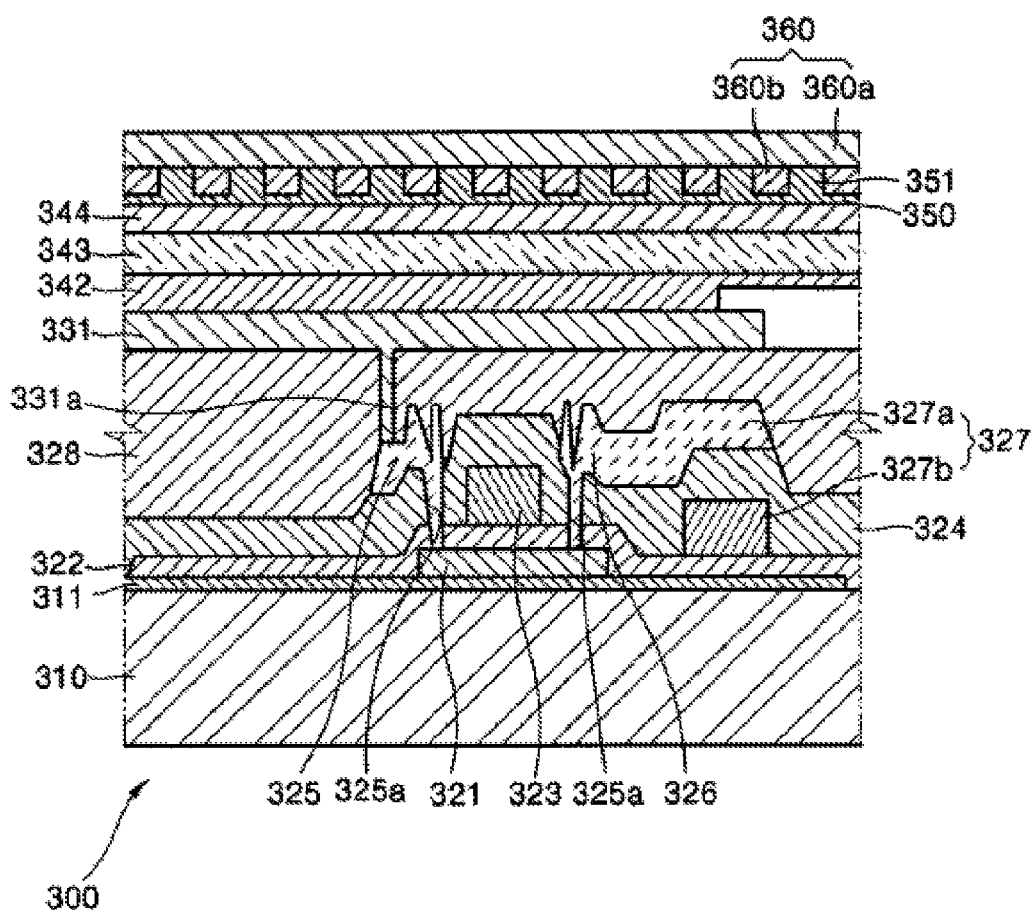

Partial cross-sectional views of an active driving EL display device according to an embodiment of the present invention are shown in FIGS. 3A and 3B. As illustrated, buffer layer 311 may be formed on a substrate 310 of the EL display device 300. One or more thin film transistors (TFT) for driving pixel forming portions, and one or more driving portions, each having a capacitor, may be arranged on top of the buffer layer 311 to produce pixels.

Buffer layer 311 may be formed of a material such as SiO2 by plasma enhanced chemical vapor deposition. However, the buffer layer 311 may be formed of other materials using other manufacturing processes. The driving portion includes a TFT and a capacitor. The TFT also includes: a p- or n-type semiconductor layer 321 formed on part of the buffer layer 311; a gate insulating layer 322 formed on the semiconductor layer 321 and the buffer layer 311; a gate electrode layer 323 formed on part of the gate insulating layer 322 above the p- or n-type semiconductor layer 321; and a first insulating layer 324 formed on the a gate insulating layer 322 and a gate electrode layer 323. The drain electrode 325 and a source electrode 326 are formed on the first insulating layer 324 and extend down to the semiconductor layer 321 via contact holes 325a, which pierce through the first insulating layer 324 and the gate insulating layer 322. The capacitor comprises a first auxiliary electrode 327a which extends from the source electrode 326, and a second auxiliary electrode 327b which is arranged on one side of the gate insulating layer 322 corresponding to the first auxiliary electrode 327a and is buried by the first insulating layer 324. A second insulating layer 328 buries the TFT and capacitor, that is, the drain electrode 325, the source electrode 326, and the first auxiliary electrode 327a.

A pixel forming portion is formed on the driving portion to produce pixels. The organic light-emitting portion includes the drain electrode 325. The first electrode layer 331 (acting as an anode pole) and the second electrode layer 343 are formed on the second insulating layer 328 which buries the source electrode 326 and the first insulating layer 324. The organic light-emitting portion also includes a second electrode layer 343 as a cathode pole, and an organic light-emitting portion 342 interposed between a first electrode layer 331 and the second electrode layer 343. The present embodiment further includes a passivation layer 344 protecting the organic light-emitting portion 342 and preventing the organic light-emitting portion 342 from deteriorating by absorbing moisture. The first electrode layer 331 comprises a conductive connecting portion 331a, which contacts one end of the drain electrode 325 via a piercing hole formed in the second insulating layer 328.

Referring to FIG. 3A, the method of manufacturing an organic EL display device according to an embodiment of the present invention begins with accumulatively forming the driving portion and the pixel region on the substrate 310.

As mentioned previously, the claimed invention is further directed to a thermal transfer donor film used to prepare the photonic crystal layer and adhere the photonic crystal layer to the stack via thermal imaging. In one embodiment, a laser transfer donor film is manufactured by sequentially forming a photothermal conversion layer 371 and a photonic crystal layer 360 below an imaging base substrate 372. The imaging base substrate 372 may be composed of a polymolecule film including a polymolecule material, and the polymolecule film may be composed of a polymolecule material such as polycarbonate, polyethylene terephthalate, polyester, poly acryl, poly epoxy, polyethylene, or polystyrene, etc. The photothermal conversion layer 371 converts light energy of the laser beam into thermal energy and can be composed of a polymer material such as carbon black and black lead, a metal such as aluminum or an aluminum oxide product.

Although not shown in the drawings, a separate interior layer composed of acryl may be formed to protect the photothermal conversion layer 371 and an exfoliating layer may be formed for the smooth exfoliation of the transfer portion and to prevent the transferring of the photothermal conversion layer 371 material on one side of the photothermal layer. The thermal transfer donor film is not limited to this and may be employed in various versions within a range of including a photonic crystal layer or excluding a photothermal conversion layer. The thermal transfer donor film has been described in specific embodiments of the present invention, however, the thermal transfer donor film may take other various forms, and may include a photonic crystal layer, according to the embodiment of the present invention.

The photonic crystal layer 360 is closely formed directly below the photothermal conversion layer 371 in FIG. 3A and may be composed of an organic material having a thickness of several µm or of one or more from the group of consisting $SiO_x$, $SiN_x$, $Si_3N_4$, $TiO_2$, MgO, ZnO, $Al_2O_3$, $SnO_2$, $In_2O_3$, $MGF_2$ and $CaF_2$. The photonic crystal layer 360 may be formed by thermal compression using a photonic crystal mold that uses Ni coating. The photonic crystal layer 360 has a base layer 360a and a plurality of protrusions 360b, which may face the substrate 310. The base layer 360a of the photonic crystal layer 360 may be a thin film and the protrusions 360b may form recessed portions or piercing holes. The recessed portions may be in a vacuum state, filled with a predetermined gas such as an inert gas, or filled with a material having a different refractive index than the material of which the protrusions 360b is composed (refer to FIGS. 3C and 3D). In addition, the protrusions 360b and base layer 360a may be composed of different materials or identical materials.

After the photonic crystal layer 360 is formed on the thermal transfer donor film, the refractive layer 350, which is composed of an organic material or one or more inorganic materials such as $SiN_x$ and $TiO_2$, may be formed below the photonic crystal layer 360. In addition, the refractive layer 350 may be planarized to prevent a bad connection with one side of the stack due to an uneven surface. The refractive layer 350 may have protrusions that correspond to the recessed portions formed by the protrusions 360b. When the protrusions 360b face the substrate 310, a structure which engages with the recessed portion formed by the protrusions may be adopted. The protrusions 360b are not limited to these structures, and the protrusions 360b may be formed on the side of the photonic crystal layer 360 opposite the refractive layer 350 of the photonic crystal layer.

In addition, although not shown in the drawings, when the photonic crystal layer is a dot type having a plurality of piercing holes, the protrusions formed on the one side facing the photonic crystal layer may have a structure that engages with the piercing holes. To increase diffraction and prevent possible defects when the photonic crystal layer is formed, the refractive layer 350, which is formed directly below the photonic crystal layer 360, should be composed of different elements than the photonic crystal layer. Additionally, the refractive index of the base layer 360a of the photonic crystal layer 360 should be different from the refractive index of the refractive layer 350.

After preparing the thermal transfer donor film, which includes the photonic crystal layer, the photonic crystal layer 360 is thermally imaged onto a surface of the stack. For example, the thermal transfer donor film is placed close to the upper surface of the EL display device 300 such that the lower surface of the thermal transfer donor film faces the upper surface of the EL display device 300.

Heat is then applied to the imaging base substrate using a heat bar, electron inductive heating, ultrasound friction heating, or a laser. Laser beams may be used due to their high precision. Thus, in one embodiment, a laser irradiation source irradiates a laser beam onto a desired region of the imaging base substrate 372. The irradiated laser beam passes through the transparent imaging base substrate and delivers energy to the photothermal conversion layer 371, which may be carbon black layers or similar layers. The photothermal conversion layer 371 converts the light energy of the irradiated laser beam to heat energy and detaches the photonic crystal layer 360 from the photothermal conversion layer 371. As shown in FIG. 3B, the detached photonic crystal layer 360 and refractive layer 350, etc. are transferred to one side of the pixel region of the EL display device 300 (e.g., on the passivation layer 344), and no spatial layer is formed between the photonic crystal layer 360 and the passivation layer 344. In addition, for example, when the passivation layer 344 is composed of an inorganic material such as $SiO_2$, $SiN_x$, etc., adherence with the passivation layer 344 may be increased by forming the refractive layer 350 of an organic material and the base layer 360a of an inorganic material.

Figure 3C:
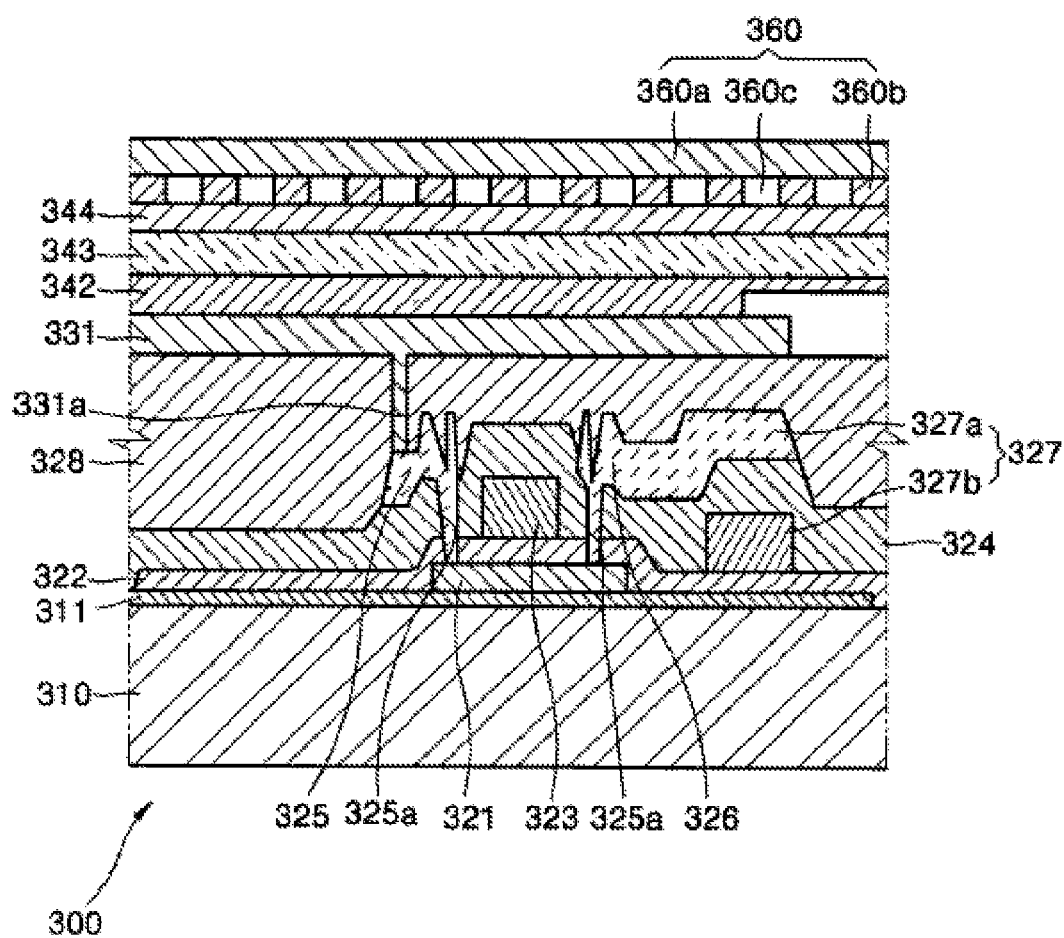
FIGS. 3C and 3D are partial cross-sectional views of an organic EL display device according to the embodiments of the present invention.
Figure 3D:
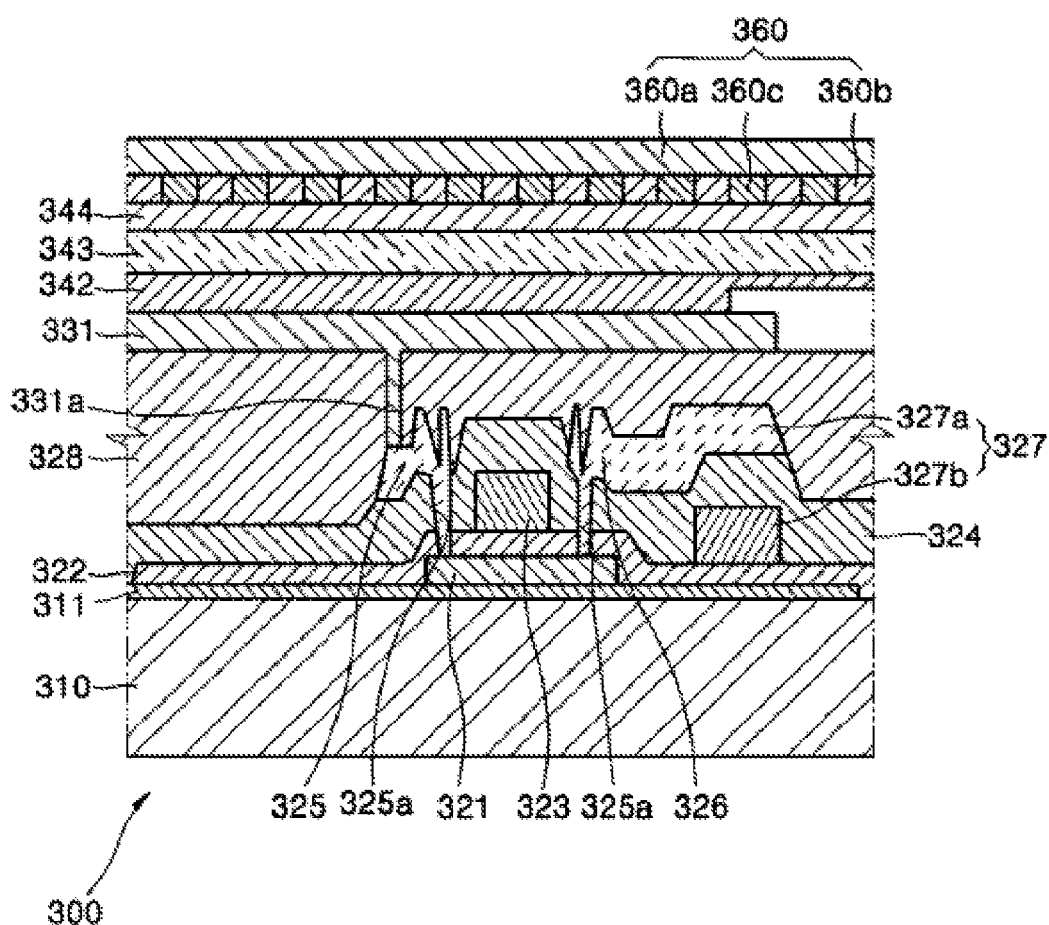

In another embodiment shown in FIG. 3C, the refractive layer 350 is not included on one side of the photonic crystal layer 360 so that at least a portion of the photonic crystal layer 360 is formed directly on the passivation layer 344. The recessed portions 360c formed by the protrusions 360b may be maintained in a vacuum state, filled with a designated gas, or may be filled with a material having a different refractive index from the material of which the protrusions 360b is composed (refer to FIG. 3D). The photonic crystal layer 360 may be a dot type photonic crystal layer with a plurality of piercing holes formed in the base layer, which may be maintained in a vacuum state, filled with designated gas, or filled with a material having a different refractive index than the base layer.

An EL display device according to another embodiment of the present invention is shown in FIG. 4. The first electrode layer 421 is formed on a substrate 410. An electron injection layer 422, an electron transportation layer 423, an organic light-emitting portion including R, G, and B light-emitting layers, 425a, 425b, and 425c, an electron transportation layer 424, and a second electrode layer 426 are sequentially formed on the substrate 410 and the previously installed first electrode layer 421. A passivation layer 430 may be formed on top to protect the organic light-emitting portion.

In addition, photonic crystal layers 450 are formed on the passivation layer 430 and refractive layers 440 may be formed between the photonic crystal layers 450 and the passivation layer 430. Because the wavelengths of the light emitting from the R, G, and B light-emitting layers, 425a, 425b, and 425c differ, the photonic crystal layers 450a, 450b, and 450c may be individually configured to correspond to the respective wavelengths of colored light. Thus, in one embodiment, the photonic crystal layers 450 formed on the passivation layer 430 are each custom patterned according to the types of light-emitting layers 425a, 425b, and 425c, (e.g., per one of colors R, G, or B).

Patterns may be made according to the sub-pixel group corresponding to the color R, the sub-pixel group corresponding to the color G, and the sub-pixel group corresponding to the color B. In one embodiment, the forms of photonic crystal layers within a sub-pixel group are different than the forms of the photonic crystal layers of any one of the other sub-pixel groups. In some cases, the photonic crystal layers within an identical group can have different forms or measurements.

Meanwhile, referring to 2A, FIG. 2B, FIG. 2C, FIG. 2D, FIG. 3A, FIG. 3B, FIG. 3C, FIG. 3D, and FIG. 4, the laser thermal transfer donor film may include a photothermal conversion layer. It may further include a photonic crystal layer which has a plurality of protrusions. Additionally included may be a plurality of piercing holes formed on the transfer donor film. The laser thermal transfer donor film may also include a refractive layer composed of a material having a different refractive index from that of a material that composes one side of the photonic crystal layer which is the furthest from the photothermal conversion layer of the photonic crystal layer. In addition, the photonic crystal layer formed on the laser thermal transfer donor film may be formed in a plurality of groups, and the measurements and physical properties of the photonic crystal layer of the groups may be different for different groups.

The above-described embodiments are described in terms of a passive driving type or an active driving type organic EL display device, however, the present invention is not limited to any one type.

The present invention with the above-described structure has the following effects.

According to embodiments of the present invention, the organic EL display device does not include spatial layers between a photonic crystal layer and a stack. Additionally, forming the photonic crystal layer on the stack improves light extraction efficiency, and solves physical problems in the manufacturing process by obviating the need to manufacture spatial layers between the photonic crystal layer and stack.

Efficiency of light extraction is further improved by including a refractive layer with the photonic crystal layer. Additionally, photonic crystal layers, which are individually formed for respective R, G, and B groups, can increase the light extraction efficiency for each wavelength of colored light emitted.

Embodiments of the organic EL display device and thermal transfer donor film described herein enable precise manufacturing using a thermal imaging method, especially a laser induced thermal imaging (LITI) method. Use of such a process significantly reduces manufacturing costs and time by eliminating the need to form spatial layers, which was a problem in the conventional manufacturing of an organic EL display device.

The various embodiments of the present invention may apply to not only a passive driving matrix (PM) organic EL display device, but also to an active driving (AM) organic EL display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electroluminescent (EL) display device, comprising:
   a substrate;
   a first electrode layer disposed on the substrate;
   a stack comprising a second electrode layer and an organic light emitting portion disposed on the first electrode layer; and
   a photonic crystal layer disposed directly on the stack, the photonic crystal layer to increase light extracting efficiency from the light-emitting portion,
   wherein the photonic crystal layer comprises a plurality of piercing holes,
   wherein the plurality of piercing holes comprise voids in a vacuum state.

* * * * *